(12) United States Patent
Patel et al.

(10) Patent No.: US 6,673,723 B2
(45) Date of Patent: Jan. 6, 2004

(54) CIRCUIT BOARD AND A METHOD FOR MAKING THE SAME

(76) Inventors: Bharat Z. Patel, 45149 Patrick Dr., Canton, MI (US) 48187; Jay D. Baker, P.O. Box 1678, Dearborn, MI (US) 48121; Lakhi N. Goenka, 621 Second St., Ann Arbor, MI (US) 48103; Michael Allen Howey, 6338 New England La., Canton, MI (US) 48187; Mohan R. Paruchuri, 46036 Gainsborough Dr., Canton, MI (US) 48187; Richard Keith McMillan, 22113 Olmstead, Dearborn, MI (US) 48124

( * ) Notice: Subject to any disclaimer, the term of this patent is extended or adjusted under 35 U.S.C. 154(b) by 109 days.

(21) Appl. No.: 09/815,226

(22) Filed: Mar. 22, 2001

(65) Prior Publication Data

US 2002/0137347 A1 Sep. 26, 2002

Related U.S. Application Data

(60) Provisional application No. 60/207,647, filed on May 26, 2000.

(51) Int. Cl.[7] ............................................. H01L 21/302
(52) U.S. Cl. ..................... 438/745; 438/750; 438/753; 216/13
(58) Field of Search ................................. 438/745, 750, 438/753, 754; 216/13, 20, 33, 34; 29/830, 852; 257/777

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 4,851,615 A | * | 7/1989 | Butt .......................... 174/68.5 |
| 5,567,982 A | * | 10/1996 | Bartelink ..................... 257/664 |
| 5,738,797 A | | 4/1998 | Belke, Jr. et al. |
| 6,163,957 A | * | 12/2000 | Jiang et al. ................... 29/852 |

* cited by examiner

*Primary Examiner*—Robert Kunemund
*Assistant Examiner*—Lan Vinh
(74) *Attorney, Agent, or Firm*—Law Offices of John G. Chupa; John G. Chupa

(57) ABSTRACT

A method 10 for making a multi-layer circuit board 70 having at least one electrically conductive interconnection portion or "via" 72 which extends within the board 70 and at least one air-bridge 74. The method 10 includes the steps of forming protuberances 13 upon a core member 12, attaching pre-circuit assemblies 32, 34 to the core member 12, thereby forming the circuit board 70 while concomitantly and selectively extending at least one of the protuberances 13 within the formed circuit board 70.

15 Claims, 8 Drawing Sheets

CIRCUIT BOARD AND A METHOD FOR MAKING THE SAME

This application claims the benefit of Provisional Application No. 60/207,647, filed May 26, 2000.

FIELD OF THE INVENTION

The present invention relates to a multi-layer circuit board and a method for making a multi-layer circuit board and more particularly, to a method for making a multi-layer electrical circuit board having at least one electrically conductive interconnection portion or "via" which selectively allows various portions and/or components residing within the electrical circuit board to be electrically and operatively connected and which further includes selectively formed air-bridges which increase the amount or density of the contained electronic components.

BACKGROUND OF THE INVENTION

Multi-layer circuit boards allow electrical and/or electronic components to selectively and operatively populate opposed surfaces of each board (or other respective interior portions of each of the boards), thereby desirably allowing each of the electrical and/or electronic circuit boards to contain a relatively large amount of electrical components which efficiently and densely populate the respective boards. It is desirable to allow each of the component-containing surfaces or portions of a created and/or formed electrical and/or electronic circuit board to communicate and/or to be selectively interconnected, thereby allowing the contained electrical components to cooperatively and selectively form one or more desired electrical circuits. This desired communication and/or interconnection typically requires the use of shared electrical ground planes, the transmittal of electrical power and/or control type signals between each of the component containing surfaces or board portions, and/or the connection of components which respectively reside on opposed surfaces and/or within diverse portions of the formed electrical circuit board.

This desired interconnection typically requires that one or more holes be drilled within each of the circuit boards, thereby physically creating at least one "through hole" or "via" which extends through at least some of the opposed component containing surfaces and through at least some of the various interior circuit board portions. Such drilling is undesirable since it is relatively time consuming, costly, potentially causes damage to significant numbers of the formed electrical circuit boards requiring these circuit boards to be destroyed, and requires costly and inefficient electroless and/or electrolytic plating of the formed holes or "vias".

While some attempts have been made to obviate the need for such plating, such as by the use of a conductive epoxy within each of the drilled holes, these attempts have not produced reliable electrical interconnections and these produced interconnections are not typically adapted to allow the communication of electrical power signals between the board surfaces. The produced apertures also do not securely and reliably receive a component.

Further, it is desirable to form "air-bridges" or "crossover type circuits" upon one or more selected surfaces and/or within certain component containing portions of the formed circuit board in order to allow multiple levels of circuits and/or electrical interconnections to be formed upon a single board surface or within a certain component containing portion of the circuit board, thereby desirably increasing the amount of electrical circuits which may be created upon and/or within the created circuit board (i.e., increasing the electrical circuit density).

These prior circuit board creating methodologies create and/or form air-bridges and crossover circuits which do not typically and efficiently accommodate certain desirable circuit board interconnection processes and/or schemes such as and without limitation, the use of relatively heavy wire bonding (e.g., using aluminum wire having a diameter of about five thousandths of an inch to about twenty thousandths of an inch) or the direct connection of components to a surface of the board.

There is therefore a need to provide a method for producing a multi-layer electrical circuit board which overcomes some or all of the previously delineated drawbacks of prior electrical circuit boards and/or board forming methodologies, which selectively allows for the efficient creation of interconnection portions which traverse the various layers of the formed electric circuit board assembly, and which further allows for the efficient and selective formation of air-bridge members or crossover members which desirably accommodate diverse types of circuit interconnection processes.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques, which allows the formed circuit board to receive various contained electronic components, which allows for the selective, efficient, and reliable formation of electrically conductive interconnection portions which selectively and cooperatively allow for communication and/or electric connection by and between at least some of these various electronic components.

It is a third object of the invention to provide a method for producing a multi-layer electrical circuit board which overcomes some or all of the previously delineated drawbacks of prior multi-layer electrical circuit board forming methodologies and techniques and which allows for the selective and efficient formation of air bridges and/or crossover members which are adapted to accommodate a wide variety of component interconnection assemblies.

According to a first aspect of the present invention, a method for making an electric circuit board is provided. The method includes the steps of providing a first member having a first and a second surface; attaching a layer of a first material to the second surface of the first member; removing at least one portion of the first member, thereby creating at least one aperture within the first member and at least one exposed portion of the first material; filling the at least one aperture with a second material; providing a first pre-circuit assembly having a first core portion which is operatively contained between a second member and a third member, and a second pre-circuit assembly having a second core portion which is operatively contained between a fourth member and a fifth member; attachably overlaying the third member upon the first surface of the first member and the second material and attachably overlaying the fourth member upon the first material, thereby creating a third pre-circuit assembly; selectively forming at least one aperture through the third pre-circuit assembly; selectively forming at least one aperture through said first pre-circuit assembly; removing at least one portion of the core portion within the first pre-circuit assembly and removing at least one portion of the core portion within the second pre-circuit assembly, thereby forming at least one cavity within the first pre-circuit assembly and at least one cavity within the second pre-circuit assembly; filling the at least one cavity within the first pre-circuit assembly and the at least one cavity within the second pre-circuit assembly with the second material; and applying a third material to the second member and to the fifth member, thereby creating a circuit assembly.

According to a second aspect of the present invention, a circuit assembly is provided. The circuit assembly is made by the process of providing at least one electrically conductive member; selectively etching that at least one electrically conductive member; providing at least one pre-circuit board having a core portion which is operatively contained between top and bottom members; attaching the pre-circuit board to at least one electrically conductive member; and selectively removing portions of the core, thereby creating a multi-layer circuit board having at least one air-bridge.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
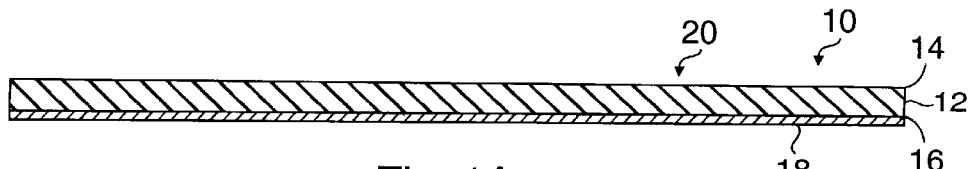
FIGS. 1(a)–(g) are successive sectional side views of a multi-layer circuit board being produced and/or formed in accordance with the teachings of the preferred embodiment of the invention.

Referring now to FIGS. 1(a)–(g), there is shown a process 10 for making an electrical circuit board assembly in accordance with the teachings of the preferred embodiment of the invention. Particularly, process 10 begins by obtaining and/or providing a member 12 having a first or top surface 14 and a second or bottom surface 16, which is best shown in FIG. 1(a).

A layer of material 18 is attached to the bottom surface 16 of member 12, thereby forming a pre-circuit assembly 20. In one non-limiting embodiment of the invention, member 12 comprises a conventional and commercially available electrically conductive material such as copper. In a further non-limiting embodiment of the invention, member 12 is generally rectangular in shape and has a thickness of about four thousandths of an inch to about eight thousandths of an inch, although other sizes, shapes, and thicknesses may be utilized. In a further non-limiting embodiment of the invention, material 18 comprises a dielectric material.

Figure 1B:
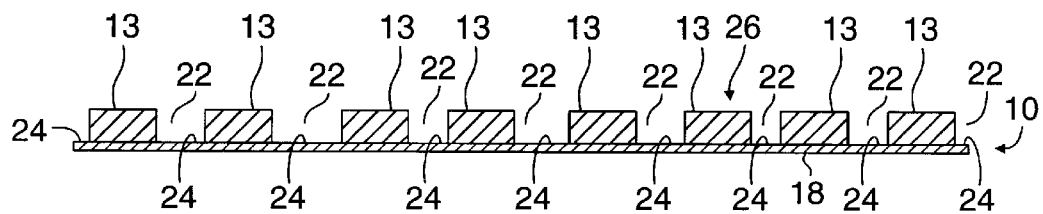

In the second step of process 10, which is best shown in FIG. 1(b), some portions of member 12 are selectively removed by a conventional etching process, thereby selectively creating certain apertures 22 within member 12, concomitantly exposing certain surface portions 24 of material 18, and concomitantly creating and/or forming several nubs, bumps, and/or protuberances 13 which comprise the portions of member 12 which are "left" and or remain intact by the foregoing etching process, thereby forming pre-circuit assembly 26. As shown later, protuberances 13 selectively form "vias" and/or cooperatively form "crossover circuit interconnections" and/or air-bridges.

Figure 1C:
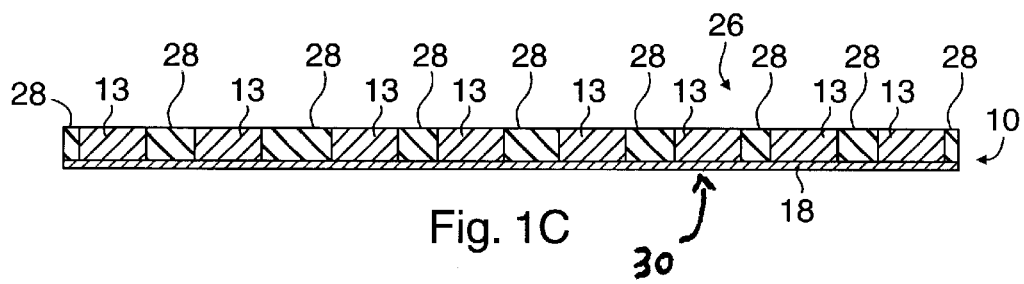

In the third step of process 10, which is best shown in FIG. 1(c), a certain substance or material 28 is applied upon pre-circuit assembly 26 and, more particularly, substantially "fills" apertures 22 and attachably overlays exposed surface portions 24, thereby forming a pre-circuit assembly 30. In one non-limiting embodiment of the invention, material 28 is a conventional and commercially available dielectric/acrylic material.

Figure 1D:
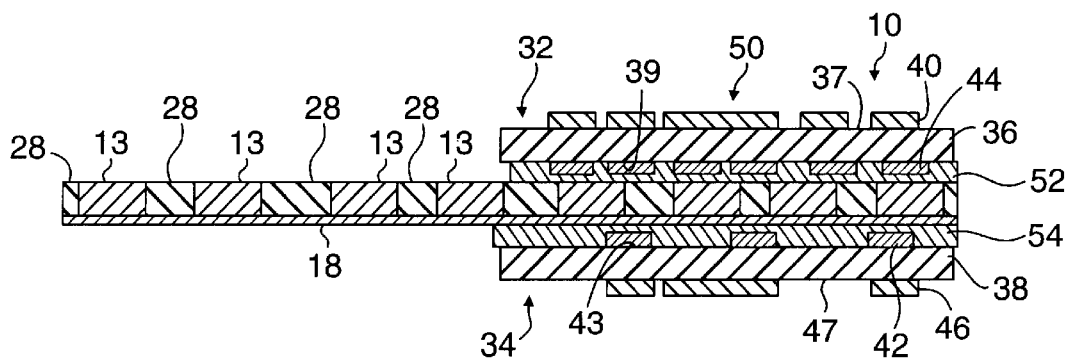

Process 10 continues, as best shown in FIG. 1(d), by providing a pair of pre-circuit assemblies 32, 34. Each pre-circuit assembly 32, 34 respectively comprises and/or includes a central core portion or member 36, 38. Several members 40, 44 are respectively disposed upon the top and bottom surfaces 37, 39 of portion 36, while several members 42, 46 are respectively disposed upon the top and bottom surfaces 43, 47 of portions 38. In one non-limiting embodiment of the invention, core portions 36, 38 each comprise a conventional and commercially available material such as aluminum. In a further non-limiting embodiment of the invention, members 40, 42, 44, 46 each comprise an conventional and commercially available electrically conductive material such as copper.

As further shown in FIG. 1(d), each of the members 44 are operatively and selectively connected and/or coupled to either a unique one of the protuberances 13 or to a unique portion of the material 28 of pre-circuit assembly 30. Further, each member 42 is operatively and selectively attached and/or coupled to material 18, thereby forming pre-circuit assembly 50.

In one non-limiting embodiment of the present invention, each member 44 is connected to member 12 and material 28 by the use of a layer of conventional adhesive material 52. In a further non-limiting embodiment of the invention, each member 42 is connected to material 18 by the use of a layer of conventional adhesive material 54. It should be understood that pre-circuit assembly 32 and pre-circuit assembly 34 may be selectively placed on substantially any desired portions of pre-circuit assembly 26.

Figure 1E:
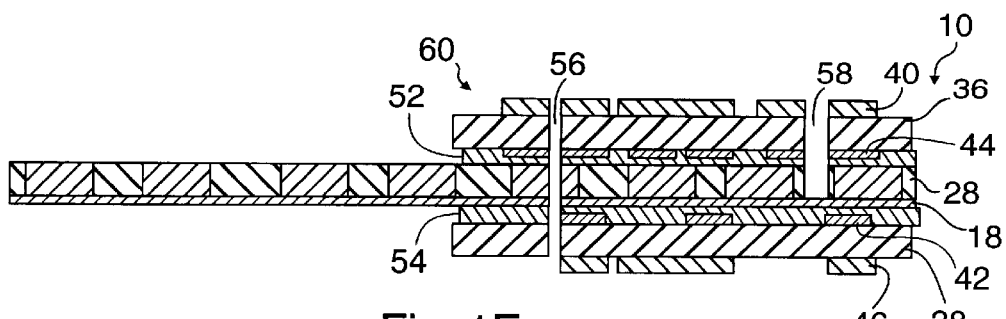

Process 10 continues, as shown best in FIG. 1(e), by forming a pre-circuit assembly 60. Particularly, pre-circuit assembly 60 is formed by creating at least one aperture 56 through pre-circuit assembly 50 and by forming at least one aperture 58 through a member 40, core portion 36, a member 44, adhesive material 52, and material 28. Aperture 58 terminates upon material 18. In one non-limiting embodiment of the invention, apertures 56, 58 may be formed by a conventional drilling or punching process. In a further non-limiting embodiment of the invention, aperture 56 may be formed by selectively applying a certain etchant material to pre-circuit assembly 50 and aperture 58 is formed by selectively applying a certain etchant material to members 40, 44, core portion 36, material 52, and material 28. It should be appreciated that apertures 56, 58 may be selectively subjected to various known methods and/or process to prepare apertures 56, 58 for the creation of electronic component connections and/or interconnections. Particularly, in one non-limiting embodiment of the invention, apertures 56, 58 are electroplated. Furthermore, in a further non-limiting embodiment of the invention, apertures 56, 58 are filled with a conventional electrically conductive and/or solder material (not shown).

Figure 1F:
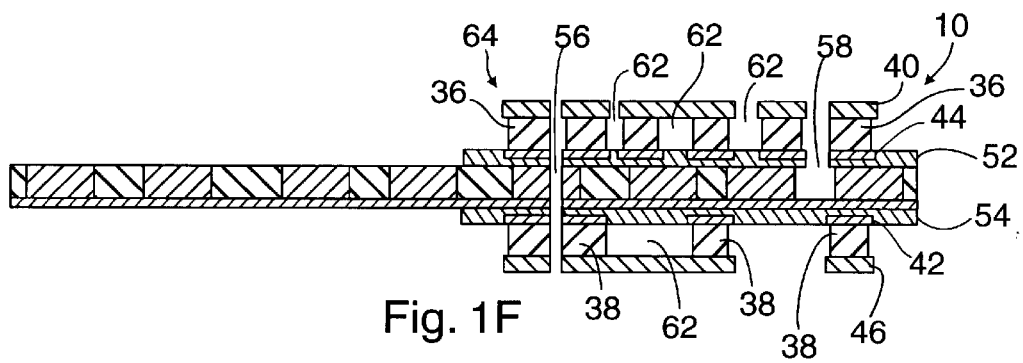

As best shown in FIG. 1(f), process 10 continues with the creation of a pre-circuit assembly 64 which is created by selectively subjecting core portions 36, 38 of pre-circuit assembly 60 to a commercially available etchant material which selectively forms cavities 62 within core portions 36, 38 of pre-circuit assembly 64.

Figure 1G:
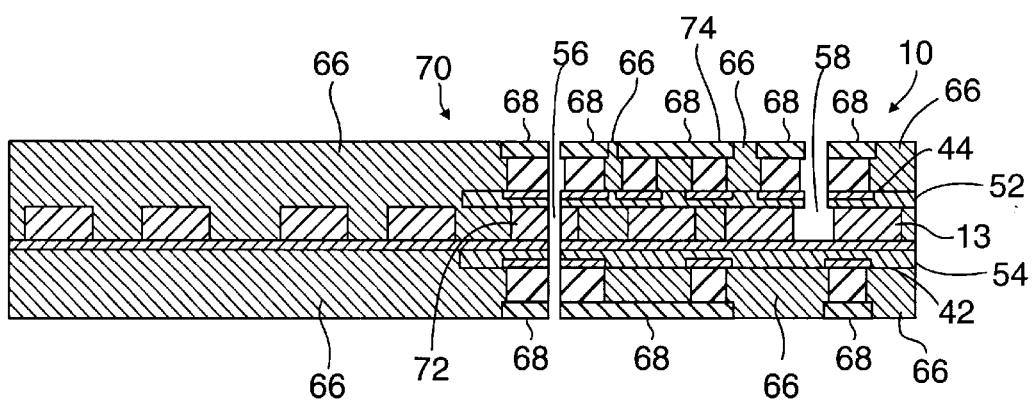

As shown in FIG. 1(g), process 10 continues by applying a certain substance or material 66 to substantially overlay protuberances 13 and materials 18, 28 and to substantially "fill" cavities 62 within pre-circuit assembly 64. In one non-limiting embodiment of the invention, material 66 comprises a conventional and commercially available dielectric/acrylic material. In a further non-limiting embodiment of the invention, material 66 is substantially similar and/or identical to material 28.

As shown in FIG. 1(g), process 10 continues by applying a certain substance or material 68 to members 40, 46, thereby creating multi-layer circuit board assembly 70. In one non-limiting embodiment of the invention, material 68 comprises a conventional and commercially available tin based alloy or any suitable conductive epoxy. In one non-limiting embodiment of the invention, material 68 is metallurgically bonded to members 40, 46.

It should be appreciated that multi-layer circuit board and/or assembly 70 includes electrically conductive "vias" or interconnection portions, such as portion 72, which extends within the multi-layer circuit board 70 and which allow some of the contained components to be selectively interconnected. More particularly and by way of example and without limitation, portion 72 is cooperatively formed from a protuberance 13 formed upon members 12, 42, 44, thereby extending the protuberance 13 within the formed multi-layer circuit assembly 70. In this manner, each or some of the previously formed protuberances 13 may be selectively extended within the formed circuit 70.

It should further be appreciated that the selective etching of members 12 and core portions 36, 38 allows the air-bridges or crossover connections, such as air-bridge 74, to be efficiently and relatively easily formed in a cost-effective manner and that these formed air-bridges, such as air-bridge 74, may accommodate a wide variety of components and interconnection assemblies.

It should further be appreciated that the apertures 56, 58 may also be efficiently formed and/or created in a "single step" operation which obviates the need to separately drill or create apertures in each member/component which selectively forms the multi-layer circuit board 70, thereby increasing the overall efficiency of process 10.

Figure 5:
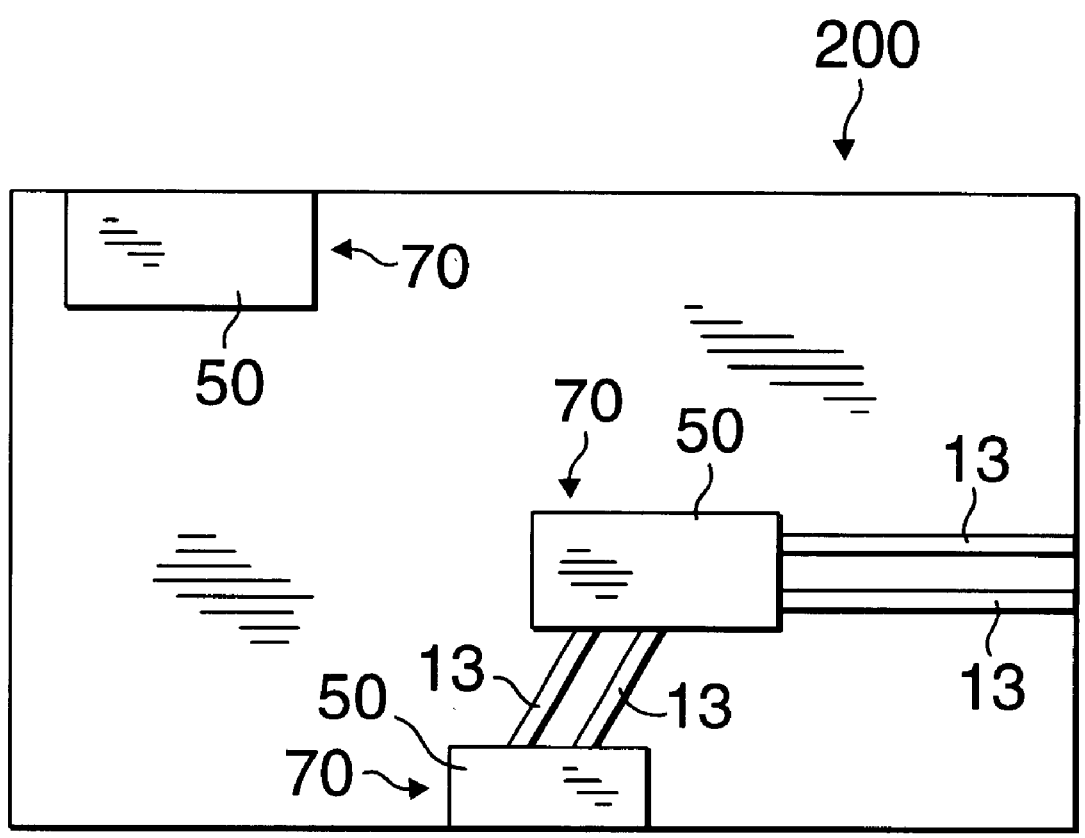
FIG. 5 is a top view of the multi-layer circuit board shown in FIG. 1 operatively and selectively populating an electrical circuit board.

It should be further appreciated that circuit board assembly 70, as shown in FIG. 5, may operatively and selectively populate certain portions of another circuit board assembly 200 and protuberances 13 form cooperatively form crossover interconnections upon the circuit board assembly 200.

Referring now to FIGS. 2(a)–(e), there is shown a method and/or a process 100 for selectively forming a multi-layer electrical circuit board, in accordance with the teachings of a second embodiment of the invention. Particularly, as is more fully delineated below, process 100 employs an adhesive material which is selectively coupled and/or applied to a core member and which is later subjected to a photo imaging process which causes the adhesive material to be configured and/or formed in a desired pattern, thereby allowing apertures to be selectively formed within the core member without drilling.

As shown, process 100 employs an electrically conductive metal foil and/or core member 102 which may comprise copper or some other conventional and commercially available metal and which is generally rectangular in shape. As shown best in FIG. 2(a), an etchable adhesive material 104 is applied to the top and the bottom surface 106, 108 of the electrically conductive core member 102. In one non-limiting embodiment, the etchable adhesive material 104 substantially covers the top and bottom surfaces 106, 108. Particularly, as should be apparent to those of ordinary skill in the art, material 104 may be "rolled", sprayed, and/or coated upon the surfaces 106, 108 or applied in a "film form" to these core member surfaces 106, 108.

Figure 2A:
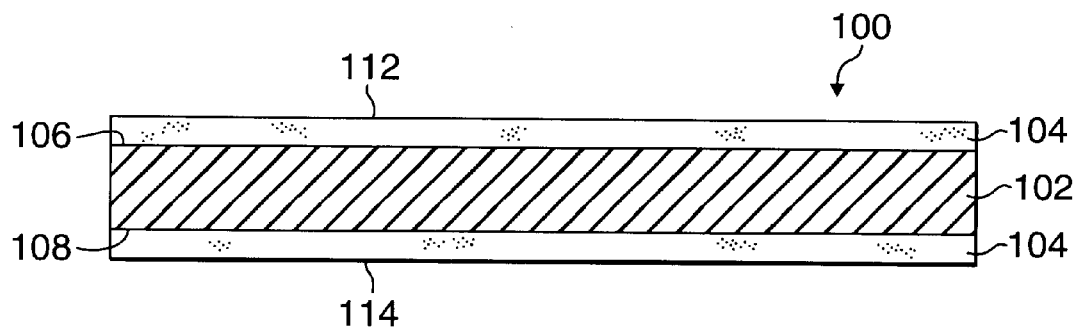
FIGS. 2(a)–(e) are successive sectional side views of a multi-layer circuit board being produced and/or formed in accordance with the teachings of a second embodiment of the invention.
Figure 2B:
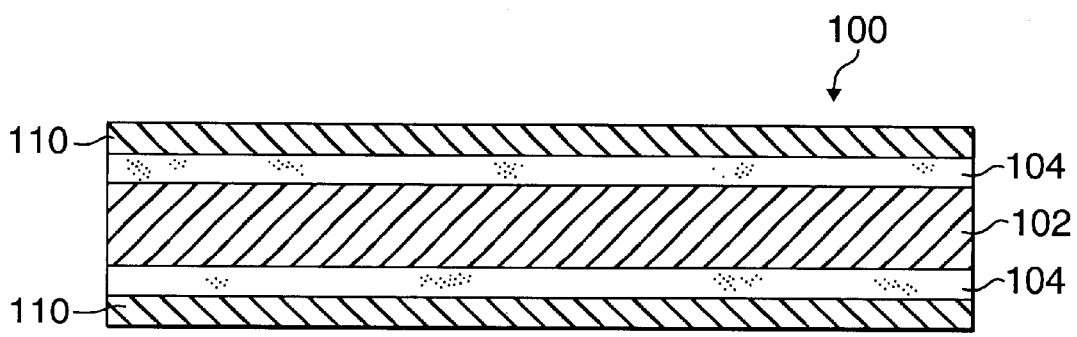

After the adhesive material 104 is applied to member 102 in the foregoing manner, the process 100 continues, as shown best in FIG. 2(b), with the step of applying a conventional and commercially available photo resistive material 110 upon the respective exposed surfaces 112, 114 of the applied adhesive material 104. In one non-limiting embodiment the photo resistive material 110 substantially covers the top and bottom surfaces 106, 108.

Figure 2C:
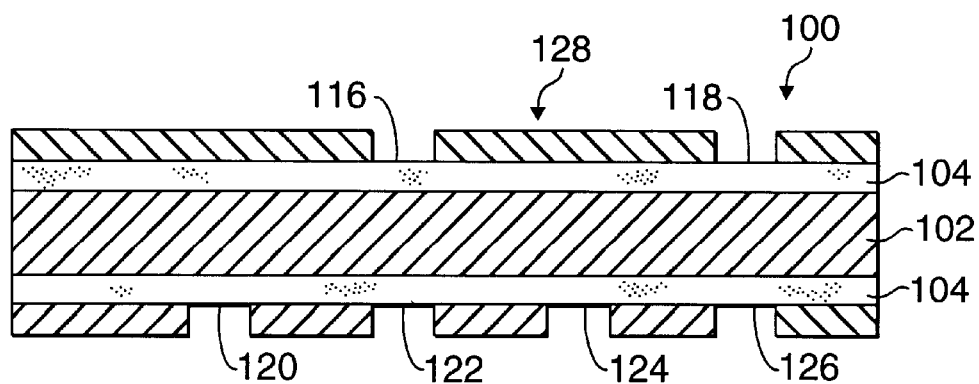

The previously applied photo resistive material 110 is then exposed and developed, in a known and conventional manner, to form exposed adhesive material portions of a selected and unique pattern. This pattern will vary depending upon the type of created circuit which is to be created and/or the type of application that the created circuit is to be used within. In one non-limiting embodiment, by way of example, and as best shown in FIG. 2(c), portions of the material 110 are removed and exposed top surface adhesive material portions 106, 108 and exposed bottom surface adhesive material portions 120, 122, 124, and 126, are concomitantly created, thereby creating a "pre-circuit" board or assembly 128.

Figure 2D:
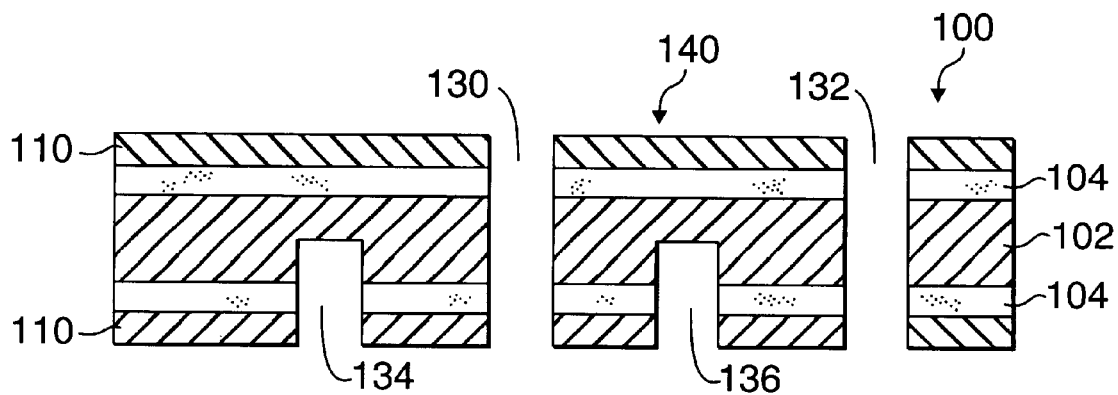

The fourth step of process 100 is shown best in FIG. 2(d) and, in this step, a second pre-circuit assembly 140 is created by subjecting pre-circuit assembly 128 to a commercially available etchant material which creates apertures through the exposed portions of the adhesive material 104. In this non-limiting example, apertures 130 and 132 are created and traverse or extend through the core member 102 and the adhesive material 104 respectively residing upon surfaces 106, 108. The etchant material also creates recesses 134, 136 which extend through the adhesive material residing upon surface 108 but which terminate within the core member 102.

Figure 2E:
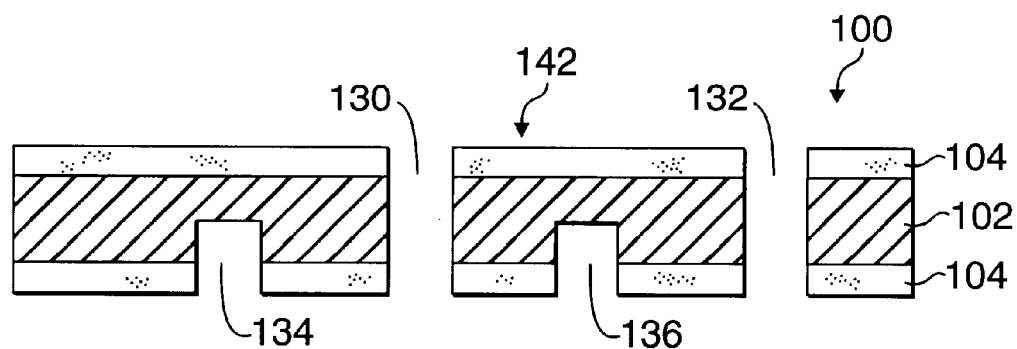

In the fifth step of process 100, which is shown best in FIG. 2(e), the photo resistive material 110 is removed from pre-circuit assembly 140 in a known manner, thereby creating a third pre-circuit assembly 142. Accordingly, pre-circuit assembly 142 may be further processed in accordance with the previously delineated steps of process 10 which are shown, for example and without limitation, in FIGS. 1(d), 1(e), 1(f), and 1(g) and/or may receive electrically conductive material upon portions 104 and form one of the pre-circuit assemblies which is selectively attached to pre-circuit assembly 26.

It should be realized that process 100, in this second non-limiting embodiment of the invention, allows for the creation of apertures 130, 132 and recesses 134, 136 without the need for drilling or screen printing, thereby providing for an overall relatively efficient and cost-effective circuit assembly process which produces a "pre-circuit board"

assembly 142 which allows for the accurate and selective formation of conductive circuits or paths and, more particularly, for the accurate and selective formation of relatively thin conductive circuits or paths, thereby increasing the overall electrical circuit density of the created and/or produced circuit board assembly. It should also be apparent to those of ordinary skill in the art that aperture 130, by use of recesses 134, 136 may be isolated from an electrical ground potential which is applied to member 102 and that aperture 132 includes and/or is integrally formed with the portion of member 102 which is communicatively coupled to the electrical ground potential applied to member 112. Further, process 100 may be employed to create a wide variety of circuit boards and/or assemblies and that, in other circuit applications, adhesive material 104 and photo resistive material 110 may only be applied to one or a portion of one of the surfaces 106, 108, thereby allowing for the selective creation of a wide variety of circuit assemblies and configurations and allowing for the selective creation of several such "grounded" and "non-grounded" apertures.

Referring now to FIGS. 3(a)–(e) there is shown a circuit board and/or circuit board assembly creation process 150 which is made and/or undertaken in accordance with the teachings of a third embodiment of the invention. Particularly, as is more fully delineated below, process 150 causes and/or requires the acquisition and/or creation of a core member 152 which is electrically conductive. In one non-limiting embodiment of the invention, core member 152 comprises copper or some other commercially available metal. Particularly, as is more fully delineated below, the core member 152 initially and selectively receives photo resistive material and is then subjected to a photo imaging process. The core member is then made to selectively receive adhesive material and the adhesive material does not substantially "wet" the previously applied photo resistive material, thereby allowing a pattern of exposed core member regions to be created. Holes or apertures are formed in the core member 152 by use of the exposed regions or portions in accordance with a certain desired circuit board/assembly configuration or a circuit board application requirement.

Figure 3A:
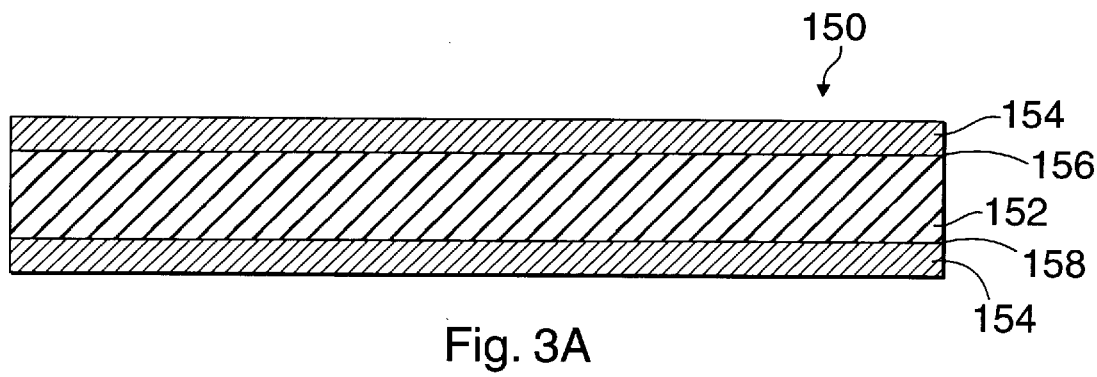
FIGS. 3(a)–(e) are successive sectional side views of a multi-layer circuit board being produced and/or formed in accordance with the teachings of a third embodiment of the invention.

As shown best in FIG. 3(a), the first step of process 150 begins with the acquisition, creation, and/or use of a core and/or foil member 152 which, in one non-limiting embodiment of the invention, is substantially identical to member 102. As further shown in FIG. 3(a), a commercially available photo resistive material 154 is initially applied to the top and bottom surfaces 156, 158 of the core and/or foil member 152. In one non-limiting embodiment of the invention, material 154 is substantially identical to material 104 of process 100.

Figure 3B:
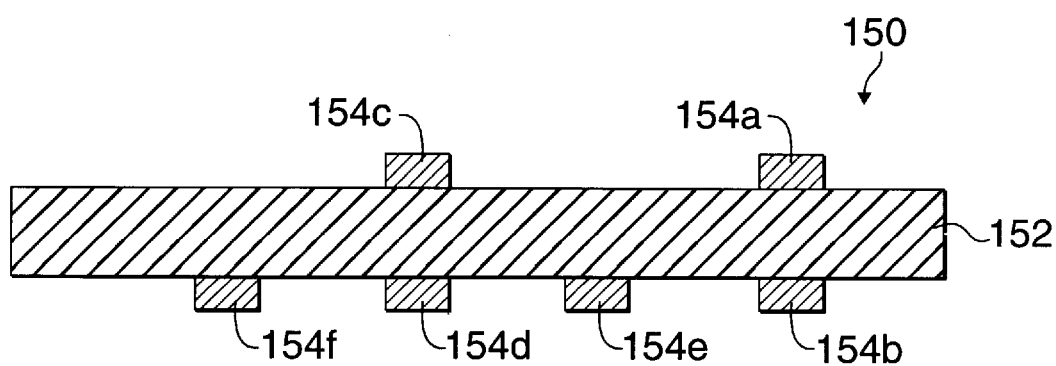

In the second step of process 150, which is best shown in FIG. 3(b), the applied photo resistive material 154 is selectively exposed, developed, and/or etched in a known manner, effective to remove most of the applied material 154 from the core member 152, and to allow the remaining material 154 to overlay only certain portions of surfaces 156, 158 and in a particular and desired pattern. One non-limiting example of one such pattern is shown in FIG. 3(b). This non-limiting pattern is presented in order to exemplify certain features of this process 150 and should not limit the generality of this invention. Specifically, portions 154(a) and 154(b); and portions 154(c), 154(d) are aligned. That is, portion 154(a) is substantially similar in size and shape to portion 154(b) and portion 154(b) wholly resides under portion 154(a) but upon an opposite surface of member 152 to the surface which portion 154(a) resides. Similarly, portion 154(c) is substantially similar in size and shape to portion 154(d) and portion 154(d) wholly resides under portion 154(c) but upon an opposite surface of member 152 to that which portion 154(d) resides. Aligned portions 154(a), 154(b); and 154(c), 154(d) cooperatively and respectively allow for the formation of "vias" or "through holes" in the created circuit assembly while those "non-aligned" portions of material 154 (e.g., portions 154(e) and 154(f)) only allow for the formation of recesses within the created circuit assembly, as shown below.

Figure 3C:
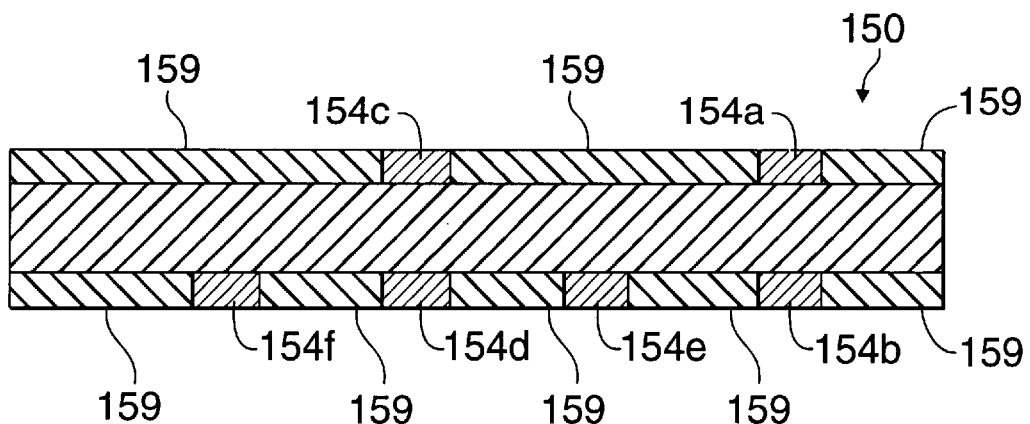

In the third step of process 150 which is best shown in FIG. 3(c), a substantially "non-wetting" or "dry" type of adhesive material 159 is applied to the exposed portion surfaces 156, 158 (i.e., to those surfaces which do not have and/or contain material 154). In the preferred embodiment of the invention, material 159 does not "wet" the surface of material 154 (e.g., the remaining portions 154(a)–154(f)), is relatively easily removable, and leaves relatively "clean" and relatively "sharp" edges. In addition, the material 159 substantially retains its desirable dielectric attributes and/or properties as the process 150 is continued in a manner which is delineated below.

Figure 3D:
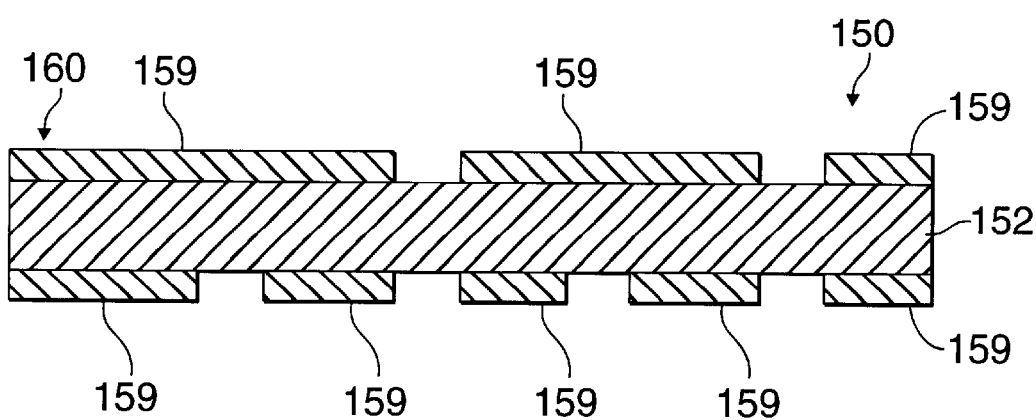
Figure 3E:
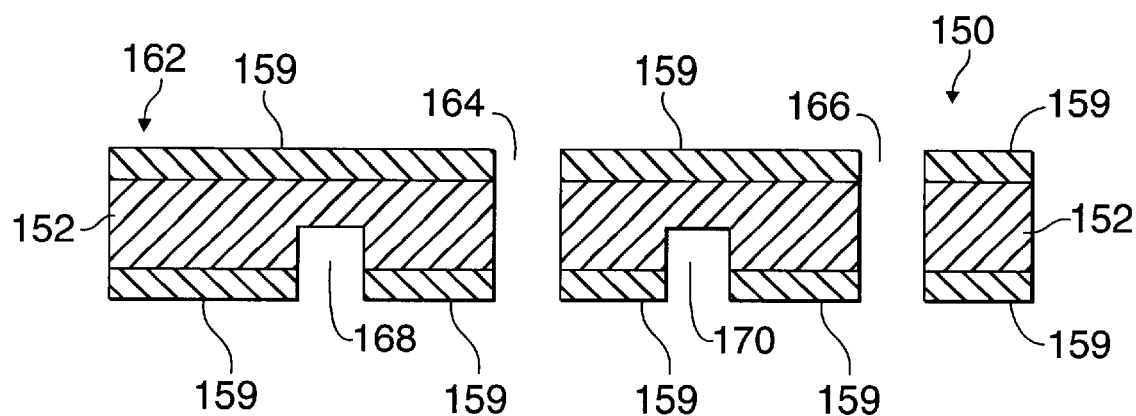

In the fourth step of process 150, as best shown in FIG. 3(d), the photo resistive material 154 (e.g., the remaining portions 154(a)–154(f)) is (are) "stripped away" by a known method, thereby creating a "pre-circuit" assembly 160. In the fifth step of process 150, the pre-circuit 160 is etched, thereby creating a pre-circuit assembly 162 having apertures 164, 166 respectively extending through the assembly 162 and, more particularly, through those respective portions of the "pre-circuit" assembly 162 previously occupied by aligned portions 154(c), 154(d); and 154(a), 154(b).

In one non-limiting embodiment of the invention, apertures 164, 166 respectively correspond to apertures 130, 132 of "pre-circuit" assembly or board 142. "Pre-circuit" assembly 162 further includes recesses 168, 170 which respectively occupy the space or position previously occupied by material portions 154(f) and 154(d), and which terminate within the core member 152 (e.g., extending into member 152 a distance equal to about one half of the width of the core member 152). These recesses 168, 170 respectively correspond to recesses 134, 136 of "pre-circuit" assembly 140 and recess 58 of the pre-circuit which is shown in FIG. 1(e) and which is formed within process 10.

It should be appreciated that process 150 allows for the selective creation of a "pre-circuit" assembly 162 having apertures 164, 166 which are formed without the use of screen printing or drilling. Moreover, these apertures 164, 166, by the use of formed recesses 168, 170 may be electrically grounded (e.g., portions of the member 152 residing within the aperture 166 may be communicatively coupled to a source of electrical ground potential) or non-grounded (e.g., portions of member 152 residing within the aperture 164 may be isolated from the source of electrical ground potential applied to certain other portions of member 152). It should be further appreciated that pre-circuit 162 may be further subjected to the process steps shown in FIGS. 1(d), 1(e), 1(f), and 1(g) and/or may receive electrically conductive material upon material 159 and form one of the pre-circuit assemblies which is selectively attached to pre-circuit assembly 26.

Figure 4A:
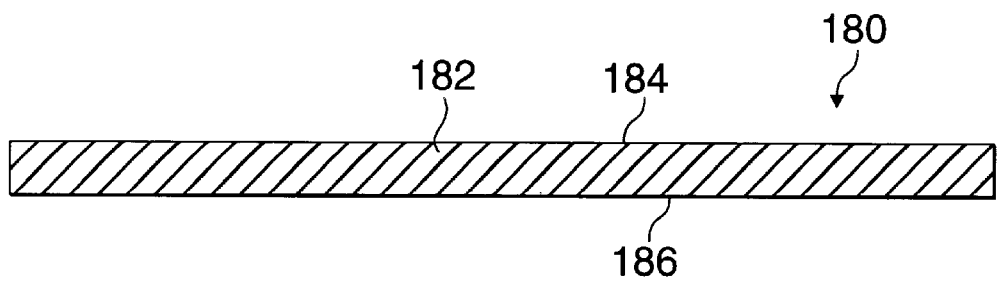
FIGS. 4(a)–(c) are successive sectional side views of a multi-layer circuit board being produced and/or formed in accordance with the teachings of a fourth embodiment of the invention.
Figure 4B:
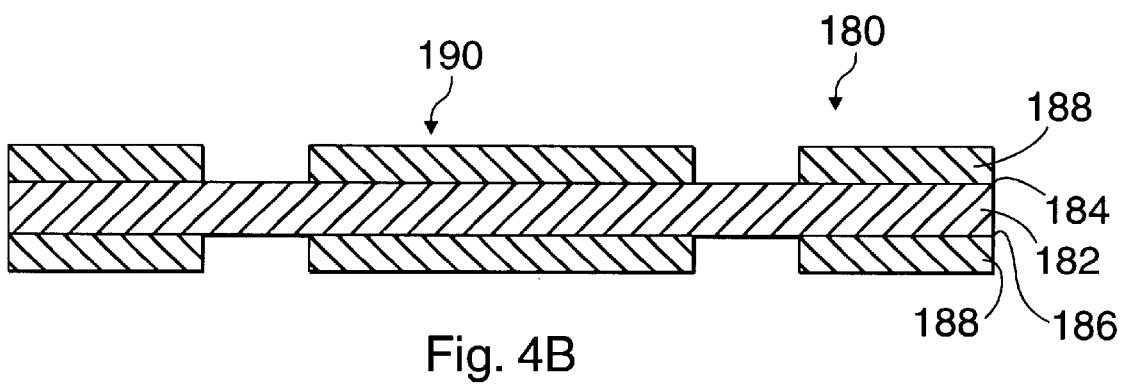
Figure 4C:
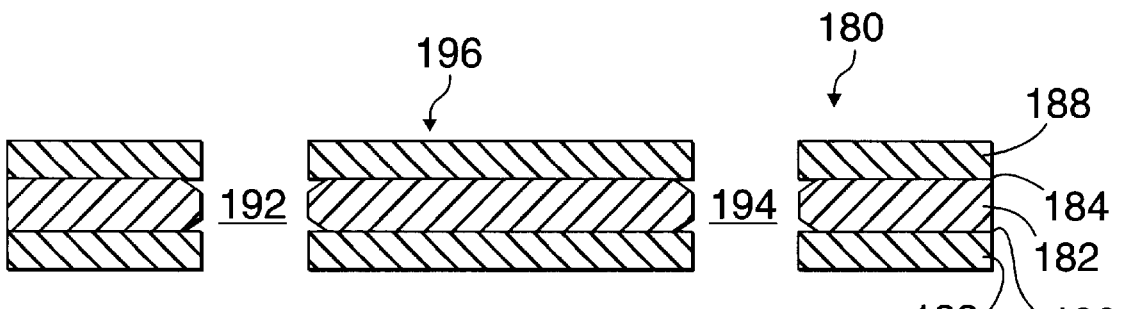

Referring now to FIGS. 4(a)–(c), there is shown a method and/or a process 180 for selectively forming a multi-layer electrical circuit board in accordance with the teachings of an alternate embodiment of the present invention. Specifically, as shown best in FIG. 4(a), the circuit board formation or creation process 180 begins with the acquisition of a core portion or member 182 having a top surface 184 and a bottom surface 186. In one non-limiting embodiment of the invention, member 182 comprises a conventional and commercially available electrically conductive material such as copper. In a further non-limiting embodiment of the invention, member or core portion 182 comprises a conventional and commercially available metal such as aluminum. In one non-limiting embodiment of the invention, metal core portion 182 is substantially similar to members 12, 36, 38, 40, and/or 44 as shown in FIG. 1(d).

The second step of process 180, as shown best in FIG. 4(b), requires that a certain commercially available "photo imageable" layer of dielectric etch resistant material 188 is selectively applied to both the top surface 184 and the bottom surface 186 of core metal portion 182, thereby forming a pre-circuit assembly 190.

The third step of process 180, as shown best in FIG. 4(c), the pre-circuit assembly 190 is selectively immersed in a conventional and commercially available etchant material, effective to create apertures and/or perforations 192, 194 within core metal portion 182, thereby forming pre-circuit assembly 196.

It should be appreciated that the pre-circuit assembly 196, as created by process 180, may be formed in a variety of shapes and sizes. It should be further be appreciated that process 180 allows for the selective creation of a pre-circuit assembly 196 having apertures 192, 194 which are formed without the use of drilling. It should be further appreciated that pre-circuit assembly 196 may be further subjected to the process steps shown in FIGS. 1(d), 1(e), 1(f), and 1(g) and/or may receive electrically conductive material upon material 188 or material 188 may be removed and a conventional adhesive material be applied to the processed member 182, effective to allow the processed member 182 to receive electrically conductive portions over surfaces 184, 186, thereby forming one of the pre-circuit assemblies which is selectively attached to pre-circuit assembly 26.

It should be understood that the invention is not limited to the exact embodiment or construction which has been illustrated and described but that various changes may be made without departing from the spirit and the scope of the invention.

What is claimed is:

1. A method for creating a circuit assembly comprising the steps of:
    providing a first member;
    selectively forming at least one protuberance within said first member by etching said first member;
    providing a first pre-circuit assembly having a core member with a first and a second surface, said pre-circuit assembly having at least a first electrically conductive portion which is disposed upon said first surface and at least a second electrically conductive portion which is disposed upon said second surface;
    attaching said at least a first electrically conductive portion of said pre-circuit assembly to said at least one protuberance, thereby creating a second pre-circuit assembly; and
    selectively etching said second pre-circuit assembly, thereby forming at least one air-bridge within said core member and creating a circuit assembly.

2. The method of claim 1 wherein said core member is formed from aluminum.

3. The method of claim 2 wherein said first member is electrically conductive.

4. The method of claim 1 further comprising the step of forming a first and a second aperture within said second pre-circuit assembly.

5. The method of claim 4 further comprising the step of causing said first aperture to terminate within said second pre-circuit assembly.

6. A method for making an electrical circuit assembly comprising the steps of:
    providing a first member having a first and a second surface;
    attaching a layer of a first material to said second surface of said first member;
    selectively removing at least one portion of said first member, thereby creating at least one aperture within said first member and at least one exposed portion of said first material;
    filling said at least one aperture with a second material;
    providing a first pre-circuit assembly having a first core portion which is operatively contained between a second member and a third member and a second pre-circuit assembly having a second core portion which is operatively contained between a fourth member and a fifth member;
    attachably overlaying said third member upon said first surface of said first member and said second material and attachably overlaying said fourth member upon said first material, thereby creating a third pre-circuit assembly;
    selectively forming at least one aperture through said third pre-circuit assembly;
    removing at least one portion of said first and second core portions, thereby forming at least one cavity within said third pre-circuit assembly; and
    filling said at least one cavity with said second material, thereby creating a circuit assembly.

7. The method of claim 6 wherein said first, second, third, fourth, and fifth members each comprise copper.

8. The method of claim 6 wherein said first material comprises a dielectric material.

9. The method of claim 6 wherein said second material comprises acrylic.

10. The method of claim 6 wherein the steps of attachably overlaying said third member upon said first surface of said first member and said second material and attachably overlaying said fourth member upon said first material comprise connecting said third member to said first surface of said first member and to said second material and connecting said fourth member to said first material with an adhesive material.

11. The method of claim 6 wherein said first core portion is formed by the process of:
    placing dielectric etch resistant material upon some portions of said first core portion; and
    etching said first core portions, effective to create at least one aperture within said first core portion.

12. The method of claim 6 further comprising the step of applying a third material to said second and fifth members.

13. The method of claim 12 wherein said third material comprises a tin based alloy.

14. The method of claim 6 wherein said first core portion is formed by the process of:
    placing an etchable adhesive material upon said first core member portion;
    placing photo resistive material on said etchable adhesive material;
    exposing and developing said photo resistive material;
    etching said first core portion, thereby selectively creating an aperture within said first core portion; and
    removing said photo resistive material from said core portion.

15. The method of claim 14 wherein said etchable adhesive material comprises a dry adhesive material.

* * * * *